United States Patent [19]

Ohkawa et al.

[11] Patent Number: 5,057,489
[45] Date of Patent: Oct. 15, 1991

[54] MULTIFILAMENTARY SUPERCONDUCTING CABLE WITH TRANSPOSITION

[75] Inventors: Tihiro Ohkawa, La Jolla; Robert A. Olstad, San Diego, both of Calif.

[73] Assignee: General Atomics, San Diego, Calif.

[21] Appl. No.: 586,535

[22] Filed: Sep. 21, 1990

[51] Int. Cl.⁵ .................... H01B 12/00; H01L 39/24
[52] U.S. Cl. ........................ 505/1; 505/884; 505/887; 505/704; 29/599; 335/216; 174/125.1
[58] Field of Search ............ 174/125.1, 128.1, 126.1, 174/15.4, 15.5; 335/216; 505/884, 885, 886, 887, 704, 705, 1; 29/599

[56] References Cited

U.S. PATENT DOCUMENTS

| | | | |
|---|---|---|---|
| 3,550,050 | 12/1970 | Albrecht | 335/216 |
| 3,638,154 | 1/1972 | Sampson et al. | 335/216 |
| 4,161,062 | 7/1979 | Agatsuma et al. | 29/599 |
| 4,329,539 | 5/1982 | Tanaka et al. | 174/125.1 |
| 4,431,862 | 2/1984 | Luhman et al. | 174/128.1 |
| 4,454,380 | 6/1984 | Turowski | 174/125.1 |
| 4,626,614 | 12/1986 | Shimamoto et al. | 174/15.5 |
| 4,970,483 | 11/1990 | Wicker et al. | 335/216 |
| 4,994,633 | 2/1991 | Puhn | 174/125.1 |

FOREIGN PATENT DOCUMENTS

| | | | |
|---|---|---|---|
| 56026-673 | 8/1979 | Japan . | |
| 0245816 | 10/1988 | Japan | 505/885 |

Primary Examiner—Leo P. Picard
Assistant Examiner—Bot Lee Ledynh
Attorney, Agent, or Firm—Nydegger & Associates

[57] ABSTRACT

A multifilamentary superconducting cable has two parallel spaced-apart guide wires. A first layer of mutually parallel superconducting filaments is woven partially around and between the guide wires in a transposed braid. Likewise, a second layer of mutually parallel superconducting filaments is woven partially around and between the guide wires in a transposed braid. Thus, the two layers overlap each other as the respective layers pass between the guide wires. The two superconducting layers and two guide wires are enclosed in a helical copper duct, with the guide wires being oriented within the duct.

18 Claims, 2 Drawing Sheets

MULTIFILAMENTARY SUPERCONDUCTING CABLE WITH TRANSPOSITION

FIELD OF THE INVENTION

The present invention relates generally to superconductors. More particularly the present invention relates to superconductors which are configured as electrical wires or cables. The present invention particularly, though not exclusively, relates to superconducting wires or cables that are configured to reduce electrical eddy currents within the cables.

BACKGROUND OF THE INVENTION

Electromagnets are widely used in modern society in a number of applications. As is well known, in its most basic sense, an electromagnet includes one or more cable leads which are coiled around a central axis. When electricity in the form of current (familiarly referred to as the transport current) is passed through the leads, a magnetic field is generated in the direction of the central axis. With the advent of relatively high temperature superconductors, i.e., superconductors which become electrically superconductive when cooled to temperatures above the boiling point of nitrogen, superconducting cables and, hence, relatively more advanced "superconductor" electromagnets and electrical transmission lines, can be produced.

One problem inherent in a multifilamentary superconducting cable is that energy-wasting eddy currents are induced in the superconducting cable when the cable is subjected to changing transverse magnetic fields. Such changing magnetic fields occur when a superconducting magnet is charged up or discharged, pulsed, or when it is in an alternating field during operation. Similarly, such changing magnetic fields occur when a superconducting transmission line is used to transmit ac current. This generation of eddy currents is particularly nettlesome in the case of electromagnets which use superconducting cables for three reasons. First, the eddy currents in the cables are dissipated in the form of heat, which warms the superconducting cable and thus reduces the current-carrying capacity of the superconducting cable. Indeed, if the heat generated by the eddy current dissipation is great enough, the superconducting cable may be heated to above its critical temperature and accordingly cease to be superconductive altogether. A corollary result of this heat build up is the need for energy dissipation and a consequent time delay in attaining an effective operational level. Second, a superconducting cable at a given temperature can conduct only a finite total amount of current. Consequently, the higher the eddy currents are in the cable, the lower is the amount of useful transport current that can be carried by the cable for generation of the magnetic field. Thirdly, the presence of eddy currents prevents stable operation of a superconducting electromagnet until the eddy currents have dissipated, so it is desirable to have a short time constant for this dissipation to occur.

In light of the above discussion, it is preferable that the generation of eddy currents within the coils of a superconducting cable of an electromagnet be minimized. It is known that one way of reducing induced eddy currents in multifilamentary superconductor cables is to transpose the superconducting filaments which make up the superconducting cable. By the term "transpose", it is meant that the individual filaments which make up the cable periodically change places with each other along the length of the cable. To effect such transposition, the axial path of each filament extends from a starting coordinate to a coordinate which is radially 180° opposite the starting coordinate, and then continues about the longitudinal axis back to a coordinate which is radially identical to the starting coordinate. The transposed path for each filament in the cable repeats itself as many times as necessary along the length of the cable. Further, it has been found that as the number of such transpositions of each superconducting filament about the longitudinal axis of the cable per unit of length of the cable is increased, unwanted eddy current effects in the superconducting cable is decreased.

Increasing the number of transpositions of the filaments per unit length of cable, however, requires a sharper bending angle in each superconducting filament with respect to the longitudinal axis of the cable. Unfortunately, the superconducting materials used to construct the superconducting filaments are typically ceramic and are thus very brittle. Importantly, while such ceramic filaments can withstand some compression, they cannot tolerate much tension. Specifically, these ceramic filaments easily break when subjected to tensile stresses as may be imposed on the filaments when the wires are bent. Consequently, if the allowable tensile limits of the superconducting filaments are exceeded during bending, the filaments weaken, fracture, and break. This, of course, results in a loss of the wire's superconducting properties. On the other hand, for wires straightened out with little or no transposition per unit of length, unwanted eddy currents are increased.

In light of these limitations, the present invention recognizes that the transposition of superconducting filaments for the reduction of unwanted eddy currents must be balanced by the competing concern for the lack of flexibility and brittleness of the superconducting filaments. The present invention accommodates these competing concerns by an arrangement of superconductor filaments in a superconducting cable which obtains the benefits of wire transposition, while staying within acceptable mechanical stress limits for the filaments.

Accordingly, it is an object of the present invention to provide a multifilamentary superconducting cable which uses transposition to effectively reduce unwanted eddy current losses. It is another object of the present invention to provide a multifilamentary superconducting cable which has sufficient flexibility so that it can be formed into desired shapes without causing loss of superconductivity. Still a further object of the present invention is to provide a multifilamentary superconducting cable which is durable and reliable in operation. Yet another object of the present invention is to provide a multifilamentary superconducting cable which exhibits desirable performance, yet is cost-effective in its manufacture.

SUMMARY OF THE INVENTION

A multifilamentary superconducting cable includes two parallel spaced apart guide wires and has a first layer and a second layer of superconducting filaments which are woven between the guide wires. More particularly, each layer of superconducting filaments is made of a plurality of elongated juxtaposed superconducting filaments which are mutually parallel. The first layer of superconducting filaments is alternately woven under and over the guide wires at a predetermined angle that is oblique to the guide wires. Likewise, the second layer of superconducting filaments is alternately woven under and over the guide wires at a predetermined angle that is oblique relative to the guide wires. Thus, each layer of superconducting filaments is wrapped partially around and between the guide wires in a braided, transposed pattern. In the preferred embodiment of the present invention, the two layers of superconducting filaments alternately overlap each other in the area between the two guide wires to establish a partially transposed pattern braid. In an alternate embodiment, the first layer of superconducting filaments always overlaps the second layer of superconducting wires in the area between the guide wires to establish the transposed pattern braid. The cable thus formed is substantially flat, i.e., the cable has a width which is substantially greater than the thickness of the cable.

Importantly, the entire superconducting cable, including the two guide wires and the two layers of superconducting filaments, may be enclosed within a hollow copper duct which can be bent. When bent, it is important that the duct have an inwardly-oriented portion and an outwardly-oriented portion, and the "flat" superconducting cable is disposed in the inwardly-oriented portion. When bent into a helix, the helix that is formed by the duct defines the orientation of the respective guide wires, each of which consequently forms a helix that is coaxial with the helical copper duct. The outwardly-oriented portion of the helical duct is made of hard copper, whereas the inwardly-oriented portion of the helical duct is made of soft copper. With this duct configuration the neutral plane of bending of the duct is shifted toward its outwardly-oriented portion, resulting in reduced tension on the relatively brittle ceramic superconducting cable which is disposed in the inwardly-oriented portion of the duct.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
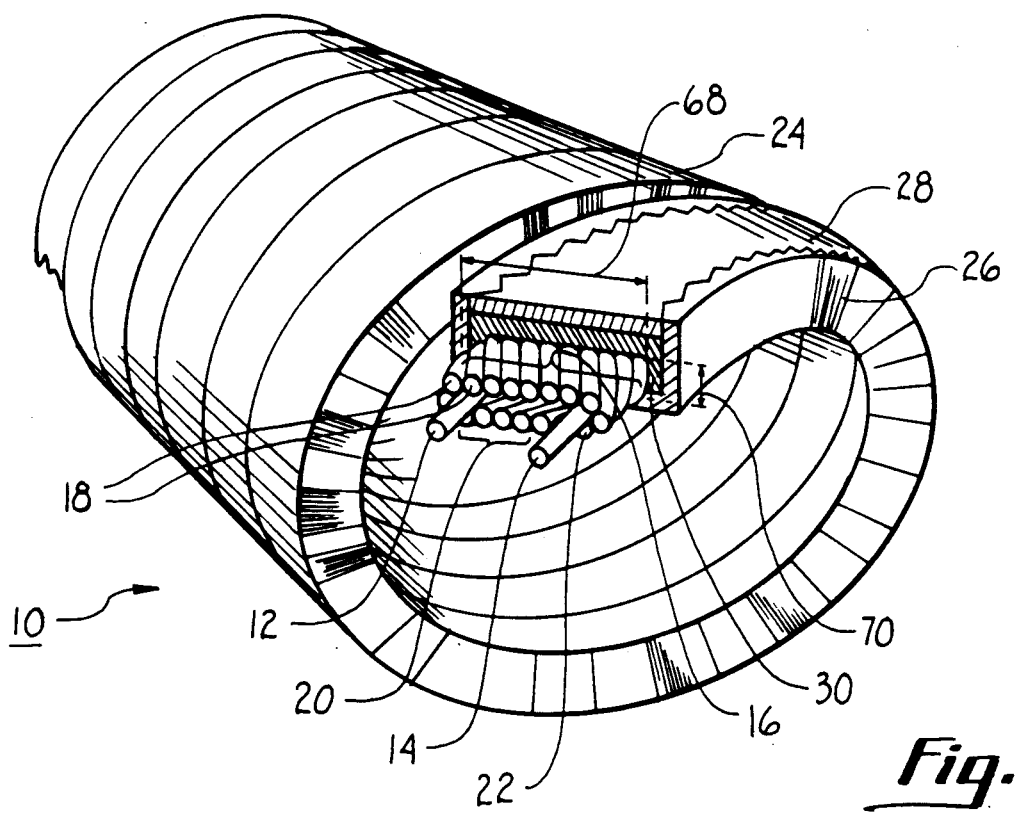
FIG. 1 is a cut-away perspective view of the multifilamentary superconductor cable of the present invention.

Referring initially to FIG. 1, a superconducting cable is shown, generally designated 10. As shown, superconducting cable 10 includes a first guide wire 12 and a second guide wire 14 which is substantially parallel to guide wire 12. The guide wires 12, 14 are made of any suitable material, preferably electrically conductive copper. Superconducting cable 10 is also shown to include a first superconducting filament layer 16 which is made of a plurality of mutually parallel superconducting filaments 18, and a second superconducting filament layer 20 which is made of a plurality of superconducting filaments 22. Each of the filaments 18, 22 is preferably composed of a suitable superconducting material that has a relatively high (i.e., above 77K) critical temperature, e.g., a bismuth- or thallium-based superconducting material, or a superconductor having the chemical designation $REBa_2Cu_3O_{7-x}$, where RE is a rare earth and $0 \leq x \leq 1$. Further, each superconducting filament 18, 22 may consist substantially entirely of a superconducting material, or may include a central elongated non-superconducting substrate on which superconducting material has been deposited.

Additionally, FIG. 1 shows that the guide wires 12, 14 and layers 16, 20 are enclosed in a copper duct 24 which has been formed in the shape of a helix. Thus, the guide wires 12, 14 are also formed into parallel helical shapes which conform to the helical shape of duct 24. As shown in FIG. 1, duct 24 includes an inwardly-oriented case portion 26 which is preferably made of soft copper and an outwardly-oriented lid portion 28 that is preferably made of hard copper. Cable 10 is shown disposed substantially entirely within case portion 26. It is to be understood that other suitable materials which have relatively high thermal and electrical conductivity, such as aluminum, may be used for duct 24. In an embodiment that uses another such material, e.g., aluminum, case portion 26 is still relatively softer than lid portion 28. In any event, to hold lid portion 28 onto case portion 26, lid portion 28 is bonded or crimped to case portion 26.

Importantly, lid portion 28 is formed on the outside of the helix that is established by duct 24. This is so in order to shift the neutral axis of bending of the cable 10 toward lid portion 28. Thus, relatively hard lid portion 28 is placed in tension, while more of the relatively soft case portion 26 (and, hence, superconducting filaments 18, 22) are consequently placed in compression. This condition is desired because superconducting filaments 18, 22 are more tolerant of compressive stresses than tensile stresses.

Lastly, a flowable filler material 30 is shown disposed within duct 24. Filler material 30 is any suitable flowable material which is electrically conductive and which can solidify to stabilize guide wires 12, 14 and layers 16, 20. Any standard solder material is preferred. As shown, filler material 30 fills substantially all the voids within duct 24 that are formed between and adjacent guide wires 12, 14.

Figure 3:
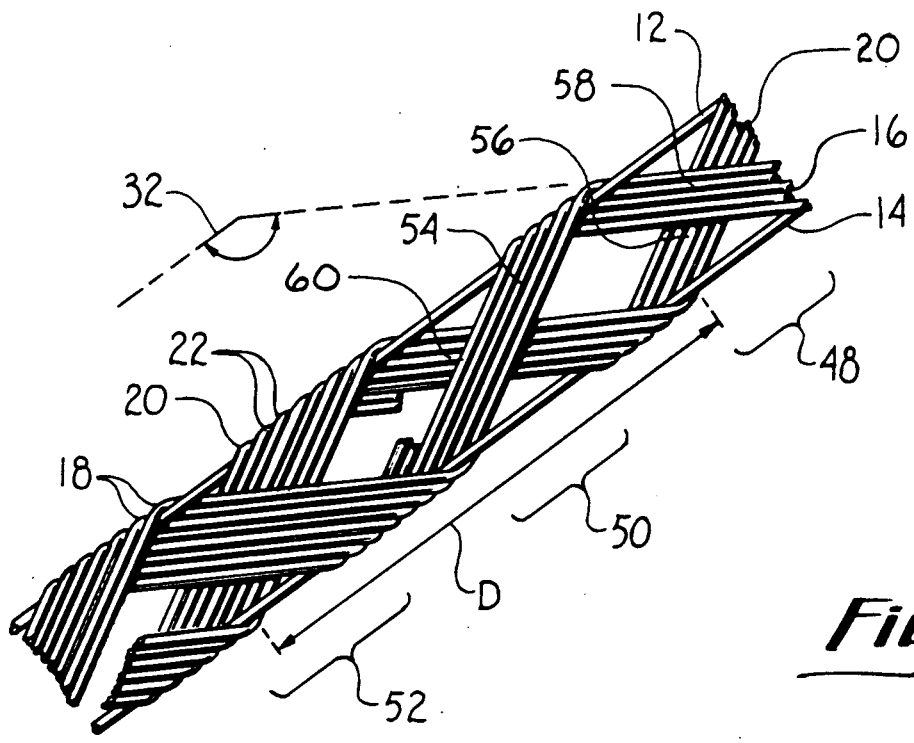
FIG. 3 is a perspective view of an alternate embodiment of the multifilamentary superconductor cable of the present invention with a portion of the superconductor filaments cut away and the copper duct removed for clarity, and with the guide wires formed in substantially straight line configurations for illustration purposes.
Figure 2:
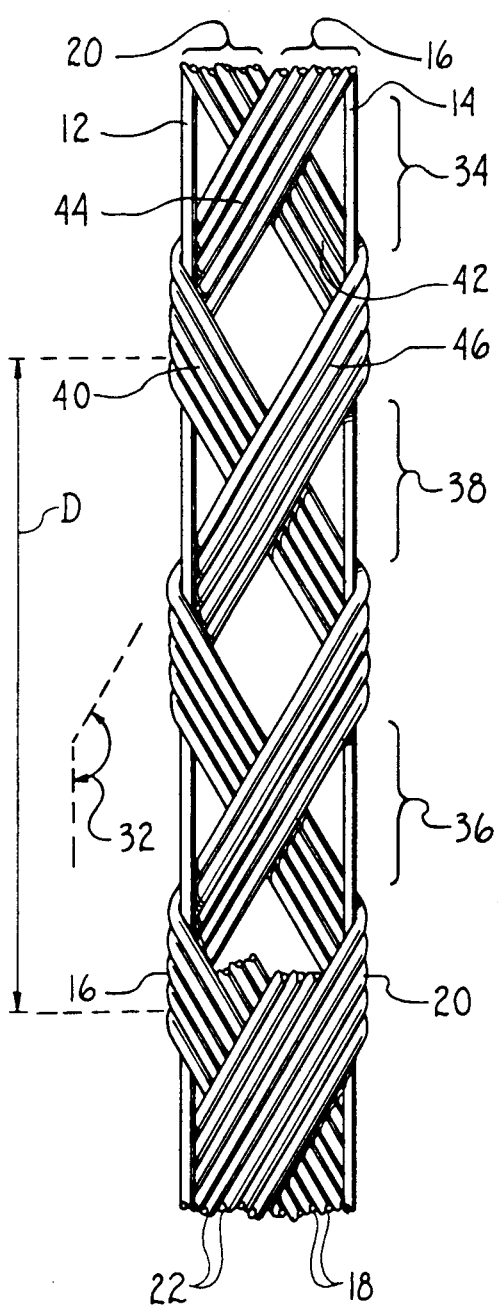
FIG. 2 is a perspective view of the preferred embodiment of the multifilamentary superconductor cable of the present invention with a portion of the superconductor filaments cut away and the copper duct removed for clarity, and with the guide wires formed in substantially straight line configurations for illustration purposes.
Figure 4:
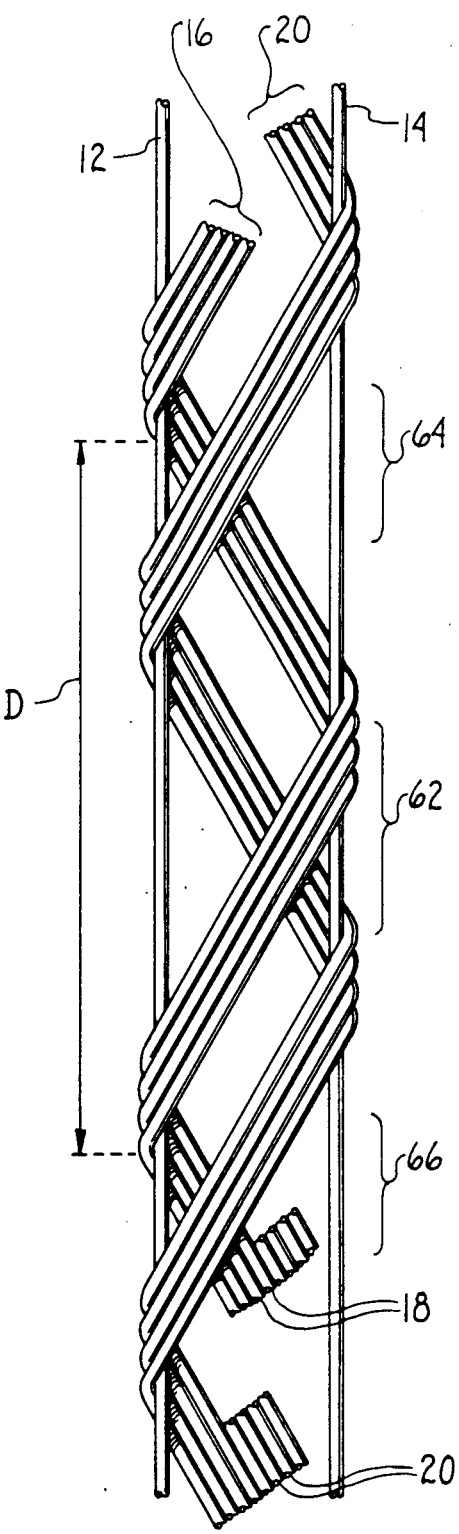
FIG. 4 is a perspective view of yet another alternate embodiment of the multifilamentary superconductor cable of the present invention with a portion of the superconductor filaments cut away and the copper duct removed for clarity, and with the guide wires formed in substantially straight line configurations for illustration purposes.

FIGS. 2, 3, and 4 respectively show the details of the preferred and alternate embodiments of cable 10. For each of these embodiments, the layers 16, 20 are shown woven or braided between the guide wires 12, 14 in a specified transposed pattern. For purposes of the present invention, a filament that is woven in a "transposed" braid is a filament that extends along guide wires 12, 14 in a non-linear, recurrent or cyclical braided pattern. For example, take a single filament 18 as shown in FIGS. 2, 3, or 4. In order to weave a filament 18 into a transposed braid having a transposition length D, the radial positions of any two points on the filament 18 which are spaced an axial distance D from each other, must be identical. Thus, by way of example only, a filament woven in a transposed braid may be woven in a "figure 8" braid, as shown in FIGS. 2 and 3, or in a helical braid, as shown in FIG. 4.

With specific regard to the "figure 8" braid shown in FIG. 2, the filaments 18 of layer 16 are shown passing in parallel sequence alternately under and over guide wires 12, 14 at an oblique predetermined pitch angle 32 relative to the axis of guide wires 12, 14 to form a "figure 8" pattern. Likewise, filaments 22 of layer 20 are passed in sequence alternately under and over guide wires 12, 14 at the same oblique pitch angle 32 relative to guide wires 12, 14 to form a "figure 8" pattern. Thus, layer 16 forms a braid which is coaxial with the braid formed by layer 20. Importantly, pitch angle 32 is established with two countervailing considerations in mind. First, a relatively large pitch angle 32 (i.e., approaching 180°) minimizes stress on the relatively brittle superconductor filaments 18, 22. On the other hand, a relatively small pitch angle 32 (i.e., approaching 90°) is comparatively more effective, relative to larger pitch angles 32, in reducing energy-wasting eddy currents which are generated in cable 10. Accordingly, as long as pitch angle 32 is obtuse, it has been found that an effective balance between the countervailing eddy current-stress considerations discussed above can be provided.

With further regard to FIG. 2, it may be seen that the layers 16, 20 alternately overlap each other (looking down on FIG. 2). While FIGS. 2 and 3 each show only three overlap regions, it is to be understood that a typical length of cable 10 will include many additional overlap regions. In other words, the longer cable 10 is, the more overlap regions cable 10 will have. As shown in FIG. 2, layer 16 overlaps layer 20 in regions 34 and 36, whereas layer 20 overlaps layer 16 in region 38. The particular braid pattern shown in FIG. 2 results in side 40 of layer 16 being the side of layer 16 which always faces layer 20 in regions 34, 36, 38 (i.e. in the overlap-/underlap regions). Likewise, side 42 of layer 20 is the side of layer 20 which always faces side 40 of layer 18 in the regions 34, 36, 38. Side 44 of layer 16 never faces layer 20 in the overlap regions 34, 36, 38, and side 46 of layer 20 never faces layer 16 in the overlap regions 34, 36, 38.

In contrast, for the alternate embodiment of cable 10 shown in FIG. 3, cable 10 is formed by a different partially transposed "figure 8" braid of layers 16, 20 between guide wires 12, 14. More particularly, FIG. 3 shows that (looking down on FIG. 3) layer 16 always overlaps layer 20. As an illustration, layer 16 overlaps layer 20 in consecutive overlap regions 48, 50 and 52. This particular braid as shown in FIG. 3, results in alternating sides of layers 16, 20 facing each other in the overlap regions. For example, in regions 48 and 52, side 54 of layer 16 faces side 56 of layer 20. Conversely, in region 50, side 58 of layer 16 faces side 60 of layer 20. As was the case for the embodiment shown in FIG. 2, layer 16 in FIG. 3 forms a braid which is coaxial with the braid formed by layer 20.

In contrast to the embodiments shown in FIGS. 2 and 3, FIG. 4 shows an embodiment of cable 10 wherein layers 16, 20 are woven around guide wires 12, 14 in co-parallel, flattened helical braids. As shown in FIG. 4, each of the layers 16, 20 is helically woven around guide wires 12, 14. Accordingly, layers 16, 20 alternately overlap each other. For example, layer 16 overlaps layer 20 in region 62, while layer 20 overlaps layer 16 in regions 64, 66. As shown in FIG. 4, the helix formed by layer 66 is coaxial with the helix formed by layer 20. It will be appreciated, however, that layers 16, 20 can be combined to form one continuous layer which will wrap around the guide wires 12, 14 to attain the same structure.

Importantly, independent of the particular type of transposed braid used, the layers 16, 20 form a substantially flat braided structure. More particularly, as best shown in FIG. 1, width 68 of layer 16 is greater than thickness 70 of layer 16. Likewise, the width of layer 20, which is equal to width 68 of layer 16, is greater than the thickness of layer 20, which is equal to the thickness 70 of layer 16. Accordingly, the juxtaposed, "flattened" layers 16, 20 can be encased in case portion 26 of duct 24 away from the neutral axis of bending of cable 10, which is shifted toward lid 28 of duct 24 as disclosed above. Consequently, layers 16, 20 are placed in compression when cable 10 is formed in the helical configuration shown in FIG. 1.

METHOD OF MANUFACTURE

In the manufacture of cable 10, reference is initially made to FIGS. 1 and 2. First, the individual superconducting filaments 18, 22 are formed by suitable means, such as by depositing a high critical temperature superconductor material onto a suitable substrate. The filaments 18 are then grouped together in a co-parallel and co-planar relationship to establish layer 16. Similarly, the filaments 22 are grouped together in a co-parallel and co-planar relationship to establish layer 20.

Next, the layers 16, 20 are woven between the parallel guide wires 12, 14 in a transposed braid pattern. For example, layers 16, 20 can be woven in the "figure 8" braid patterns shown in FIGS. 2 and 3, or the helical braid pattern shown in FIG. 4. More particularly, the superconducting filaments 18 of layer 6 are passed in sequence alternately over and under guide wires 12, 14 at a pitch angle 32 that is oblique relative to the axis of the guide wires 12, 14. Likewise, the superconducting filaments 22 of layer 20 are passed in sequence alternately over and under guide wires 12, 14 at the pitch angle 32 The layers 16, 20 may be woven between the guide wires 12, 14 alternatingly overlapping each other in a "figure 8" braid, as shown in FIG. 2. Specifically, the layers 16, 20 may be woven such that layer 16 overlaps layer 20 in overlap region 34, layer 20 overlaps layer 16 in region 36, layer 16 again overlaps layer 20 in region 38, and so on. Alternatively, layers 16, 20 may be woven between the guide wires 12, 14 in a "figure 8" braid with layer 16 always overlapping layer 20, as shown in FIG. 3. Specifically, as shown in FIG. 3, layers 16, 20 may be woven so that layer 16 overlaps layer 20 in consecutive overlap regions 48, 50, 52. Finally, layers 16, 20 may be woven in co-parallel helical braids, as shown in FIG. 4.

Once the layers 16, 20 of respective superconducting filaments 18, 22 are woven between guide wires 12, 14 as disclosed above, guide wires 12, 14 and layers 16, 20 are enclosed in copper duct 24. More specifically, guide wires 12, 14 and layers 16, 20 are positioned in case portion 26 of duct 24. Then, lid portion 28 of duct 24 is positioned onto case portion 26, as shown in FIG. 1, and then bonded or crimped to case portion 26. A suitable filler material 30, such as solder, is made flowable by melting filler material 30. Filler material 30 can then be disposed within duct 24 to fill the voids in duct 24 that have not already been filled by guide wires 12, 14 or layers 16, 20. Filler material 30, once cooled and solidified, also stabilizes wires 12, 14 and layers 16, 20. Finally, duct 24 may be bent into the helical shape shown in FIG. 1.

While the particular multifilamentary superconducting cable with transposition as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

What is claimed is:

1. A multifilamentary superconducting cable comprising:
    a first guide wire;
    a second guide wire disposed substantially parallel to said first guide wire;
    a first layer having a plurality of mutually parallel superconducting filaments, said first layer being alternatingly passed in sequence under and over said first guide wire and said second guide wire at a predetermined oblique angle; and
    a second layer having a plurality of mutually parallel superconducting filaments, said second layer being alternatingly passed in sequence under and over said second guide wire and said first guide wire at said predetermined oblique angle with said first and second layers alternatingly overlapping each other as said respective layers pass between said first and second guide wires.

2. A cable as recited in claim 1, wherein said first and second guide wires are each formed into the shape of a helix, said helices being substantially coaxial.

3. A cable as recited in claim 2, further comprising a helical duct filled with a filler, and wherein said first and second guide wires are disposed within said duct.

4. A cable as recited in claim 1, wherein said layers diagonally overlap one another between said first and second guide wires.

5. A cable as recited in claim 3, wherein said helical duct comprises a case portion made of soft copper and a lid portion made of hard copper, said lid portion forming the outer portion of said helical duct.

6. A multifilamentary superconducting cable comprising:
    a first guide wire;
    a second guide wire disposed substantially parallel to said first guide wire; and
    a first layer having a plurality of mutually parallel superconducting filaments, said first layer being alternatingly passed in sequence under and over said first guide wire and said second guide wire at a predetermined oblique angle.

7. A cable as recited in claim 6, further comprising a second layer having a plurality of mutually parallel superconducting filaments, said second layer being alternatingly passed in sequence under and over said second guide wire and said first guide wire at said predetermined oblique angle with said first layer overlapping said second layer as said respective layers pass between said first and second guide wires.

8. A cable as recited in claim 7, wherein said first and second guide wires are each formed into the shape of a helix, said helices being substantially coaxial.

9. A cable as recited in claim 8, further comprising a helical copper duct filled with a filler, and wherein said first and second guide wires are oriented within said duct.

10. A cable as recited in claim 9, wherein said filaments establish an obtuse angle with said first guide wire and with said second guide wire.

11. A multifilamentary high critical temperature superconducting cable, which comprises:
    a first layer having a plurality of mutually parallel superconducting filaments, said first layer being transposed along said cable;
    a second layer having a plurality of mutually parallel superconducting filaments said second layer being transposed along said cable and braided with said first layer to form a transposed braid pattern having a common axis; and
    means for supporting said first and second layers in said transposed braid pattern, wherein said supporting means includes a first elongated guide wire; and a second elongated guide wire disposed substantially parallel to said first guide wire, said guide wires being oriented along said layers parallel to said axis of said braid patterns.

12. A cable as recited in claim 11, wherein said first and second guide wires are each formed into the shape of a helix, said helices being substantially coaxial.

13. A cable as recited in claim 12, further comprising a helical duct filled with a filler, and wherein said first and second guide wires are oriented within said duct.

14. A cable as recited in claim 13, wherein said filaments establish an oblique angle with said first guide wire and with said second guide wire.

15. A cable as recited in claim 14, wherein said layers diagonally overlap one another between said first and second guide wires to establish said transposed braid pattern.

16. A cable as recited in claim 15, wherein said helical duct comprises a case portion made of soft copper and a lid portion made of hard copper, said lid portion forming the outer portion of said helical duct.

17. A method for manufacturing a multifilamentary high critical temperature superconducting cable, which comprises the steps of:
    disposing a first elongated guide wire adjacent and parallel to a second elongated guide wire;
    passing a first layer of mutually parallel superconducting filaments in sequence over and under said first guide wire and over and under said second guide wire at a predetermined oblique angle to said first and second guide wires; and
    passing a second layer of mutually parallel superconducting filaments in sequence over and under said first guide wire and over and under said second guide wire t said predetermined oblique angle to said first and second guide wires to overlap said first layer and establish a transposed braid pattern.

18. A method for manufacturing a cable as recited in claim 17 further comprising the steps of:
    enclosing said first and second guide wires and said first and second layers in a helical duct, said first and second guide wires being oriented within said duct; and
    depositing a flowable filler material within said duct.

* * * * *